(12) United States Patent
Brunker et al.

(10) Patent No.: US 7,151,420 B2
(45) Date of Patent: *Dec. 19, 2006

(54) ELECTROMAGNETICALLY SHIELDED SLOT TRANSMISSION LINE

(75) Inventors: David L. Brunker, Naperville, IL (US); Victor Zaderej, St. Charles, IL (US)

(73) Assignee: Molex Incorporated, Lisle, IL (US)

( * ) Notice: Subject to any disclaimer, the term of this patent is extended or adjusted under 35 U.S.C. 154(b) by 63 days.

This patent is subject to a terminal disclaimer.

(21) Appl. No.: 11/023,879

(22) Filed: Dec. 23, 2004

(65) Prior Publication Data

US 2005/0156690 A1 Jul. 21, 2005

Related U.S. Application Data

(60) Provisional application No. 60/532,718, filed on Dec. 24, 2003.

(51) Int. Cl.
*H01P 3/08* (2006.01)
(52) U.S. Cl. .................. 333/4; 333/5; 333/238
(58) Field of Classification Search .............. 333/4, 333/5, 236, 238, 246, 33, 34, 1
See application file for complete search history.

(56) References Cited

U.S. PATENT DOCUMENTS

| | | | |
|---|---|---|---|
| 3,093,805 A * | 6/1963 | Osifchin et al. ............. 333/1 |
| 3,293,353 A | 12/1966 | Hendriks et al. | |
| 3,411,148 A | 11/1968 | Fetterolf et al. | |
| 4,710,854 A | 12/1987 | Yamada et al. | |
| 2002/0127924 A1 | 9/2002 | Miura et al. | |
| 2003/0179050 A1* | 9/2003 | Brunker et al. ............. 333/4 |
| 2005/0151597 A1 | 7/2005 | Brunker et al. | |
| 2005/0151604 A1 | 7/2005 | Brunker et al. | |
| 2005/0168303 A1 | 8/2005 | Brunker et al. | |
| 2005/0174191 A1 | 8/2005 | Brunker et al. | |
| 2005/0201065 A1 | 9/2005 | Regnier et al. | |
| 2005/0202722 A1 | 9/2005 | Regnier et al. | |
| 2006/0139117 A1 | 6/2006 | Brunker et al. | |

FOREIGN PATENT DOCUMENTS

| EP | 0 343 771 | 11/1989 |
|---|---|---|
| WO | WO 03/058750 | 7/2003 |

OTHER PUBLICATIONS

Turinsky, G. "Streifenleiter Hoher Packungsdihte" Rdaio Fernsehen Elektronik, Veb Verlag Technik, vol. 41, No. 8 Aug. 1, 1992, pp. 537-538.
Search Report of International Application No. PCT/US2004/043882, Apr. 19, 2005.

* cited by examiner

*Primary Examiner*—Stephen E. Jones
(74) *Attorney, Agent, or Firm*—Thomas D. Paulius

(57) ABSTRACT

An electro-magnetically shielded slot-transmission line is formed by metallizing the opposing sides of a slot cut through a dielectric substrate. A ground plane is deposited on the bottom of the substrate. Conductive vias through the substrate and that contact the ground plane are located on both sides of the metallized slot surfaces. Conductive pads on the upper surface and which contact the vias provide additional shielding.

8 Claims, 14 Drawing Sheets

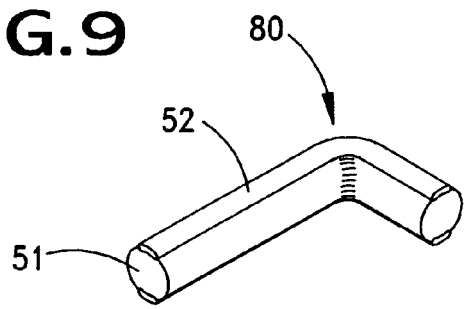
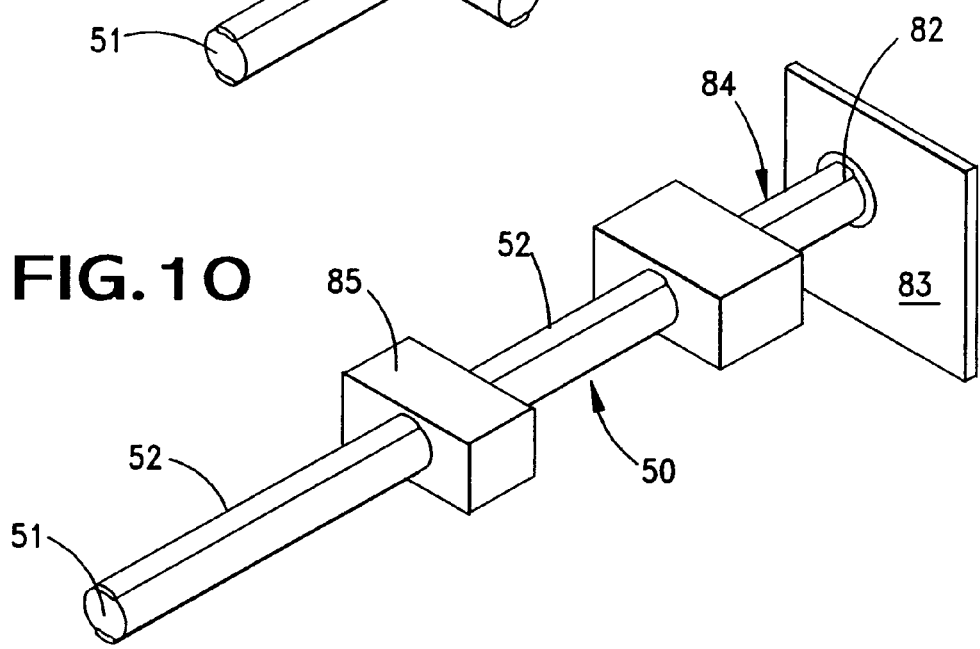
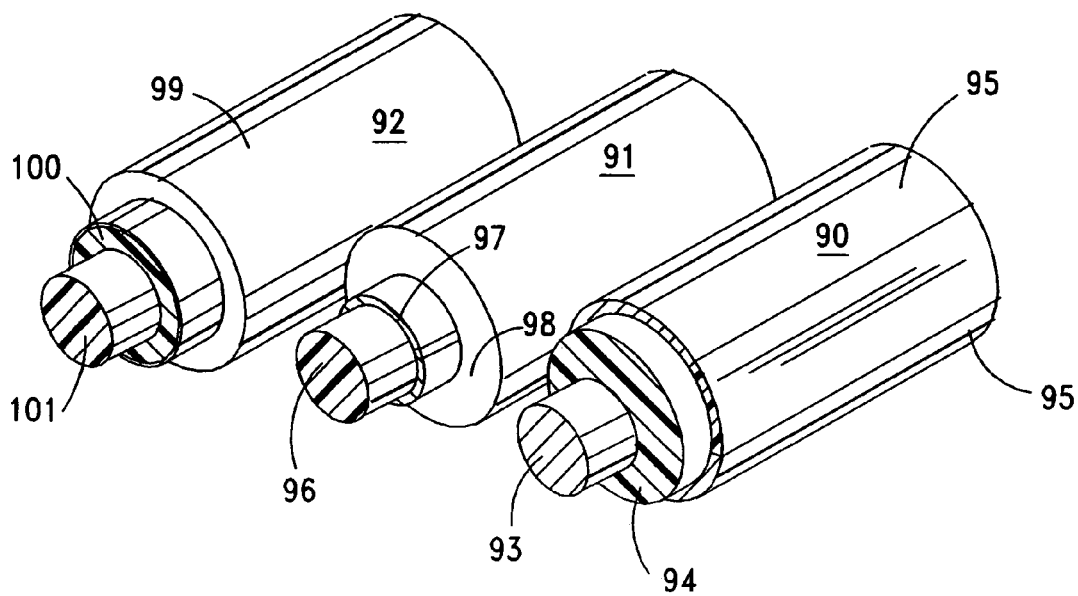

ELECTROMAGNETICALLY SHIELDED SLOT TRANSMISSION LINE

REFERENCE TO RELATED APPLICATIONS

The present application claims priority from prior U.S. Provisional Patent Application No. 60/532,718, filed Dec. 24, 2003.

BACKGROUND OF THE INVENTION

The present invention pertains to multi-circuit electronic communication systems, and more particularly, to a dedicated transmission channel structure for use in such systems and these transmission channel structures may be utilized in all parts of a transmission system, chip packaging, circuit board construction, interconnect devices, launches from and to chips, circuit boards, interconnects and cables.

Various means of electronic transmission are known in the art. Most, if not all of these transmission means, suffer from inherent speed limitations such as both the upper frequency limit and the actual time a signal requires to move from one point to another within the system, which is commonly referred to as propagation delay. They simply are limited in their electronic performance primarily by their structure, and secondarily by their material composition. One traditional approach utilizes conductive pins, such as those found in an edge card connector as is illustrated in FIG. 1. In this type of structure a plurality of conductive pins, or terminals 20, are arranged within a plastic housing 21 and this arrangement provides operational speeds of about 800 to 900 MHz. An improvement upon this standard structure is represented by edge card connectors that may be known in the art as "Hi-Spec" and which are illustrated in FIG. 2, in which the system includes large ground contacts 25 and small signal contacts 26 disposed within an insulative connector housing 27. The smaller signal contacts 26 couple to the larger ground contacts 25. The signal contacts in these structures are not differential signal contacts, but are merely single-ended signal, meaning that every signal contact is flanked by a ground contact. The operational speeds for this type of system are believed to be about 2.3 Ghz.

Yet another improvement in this field is referred to as a "triad" or "triple" connector in which conductive terminals are disposed within a plastic housing 28 in a triangular pattern, and the terminals include a large ground terminal 29, and two smaller differential signal terminals 30, as illustrated in FIG. 3, and, as described in greater detail U.S. Pat. No. 6,280,209. This triad/triple structure has an apparent upper limit speed of about 4 Ghz. All three of these approaches utilize, in the simplest sense, conductive pins in a plastic housing in order to provide a transmission line for electronic signals.

In each of these type constructions, it is desired to maintain a functional transmission line through the entire delivery path of the system, including through the circuit board(s), the mating interface and the source and load of the system. It is difficult to achieve the desired uniformity within the system when the transmission system is constructed from individual pins. Discrete point-to-point connections are used in these connectors for signal, ground and power. Each of these conductors was designed as either a conductor or a means of providing electrical continuity and usually did not take into account transmission line effects. Most of the conductors were designed as a standard pinfield so that all the pins, or terminals, were identical, regardless of their designated electrical function and the pins were further arranged at a standard pitch, material type and length. Although satisfactory in performance at low operating speeds, at high operational speeds, these systems would consider the conductors as discontinuities in the system that affect the operation and speed thereof.

Many signal terminals or pins in these systems were connected to the same ground return conductor, and thus created a high signal to ground ratio, which did not lend themselves to high-speed signal transmission because large current loops are forced between the signals and the ground, which current loops reduce the bandwidth and increase the cross talk of the system, thereby possibly degrading the system performance.

Bandwidth ("BW") is proportional to $1/\sqrt{LC}$, where L is the inductance of the system components, C is the capacitance of the system components. The inductive and capacitive components of the signal delivery system work to reduce the bandwidth of the system, even in totally homogeneous systems without discontinuities. These inductive and capacitive components can be minimized by reducing the overall path length through the system, primarily through limiting the area of the current path through the system and reducing the total plate area of the system elements. However, as the transmission frequency increases, the reduction in size creates its own problem in that the effective physical length is reduced to rather small sizes. High frequencies in the 10 Ghz range and above render most of the calculated system path lengths unacceptable.

In addition to aggregate inductance and capacitance across the system being limiting performance factors, any non-homogeneous geometrical and/or material transitions create discontinuities. Using about 3.5 Ghz as a minimum cutoff frequency in a low voltage differential signal system operating at around 12.5 Gigabits per second (Gbps), the use of a dielectric with a dielectric constant of about 3.8 will yield a critical path length of about 0.25 inches, over which length discontinuities may be tolerated. This dimension renders impracticable the ability of one to construct a system that includes a source, transmission load and load within the given quarter-inch. It can thus be seen that the evolution of electronic transmission structures have progressed from uniform-structured pin arrangements to functionally dedicated pins arrangements to attempted unitary structured interfaces, yet the path length and other factors still limit these structures. With the aforementioned prior art structures, it was not feasible to carry high frequency signals due to the physical restraints of these systems and the short critical path lengths needed for such transmission.

In order to obtain an effective transmission structure, one must maintain a constant and dedicated transmission line over the entire delivery path: from the source, through the interface and to the load. This would include the matable interconnects and printed circuit boards, the interconnect signal launch into and out from the circuit boards or other transmission media such as cables and even the semiconductor device chip packaging. This is very difficult to achieve when the delivery system is constructed from individual, conductive pins designed to interconnect with other individual conductive pins because of potential required changes in the size, shape and position of the pins/terminals with respect to each other. For example, in a right angle connector, the relationship between the rows of pins/terminals change in both the length and the electrical coupling. High speed interconnect design principles that include all areas between the source and load of the system including chip pacakaging, printed circuit boards, board connectors and cable assemblies are being used in transmission systems with sources of up to 2.5 Gbps. One such principle is the principle of ground by design, which provides added performance over a standard pin field in that coupling is enhanced between the signal and ground paths and single-ended operation is complimented. Another principle being used in such systems includes impedance tuning to minimize discontinuities. Yet another design principle is pinout optimization where signal and return paths are assigned to specific pins in the pin field to maximize the performance. These type of systems all are limited with respect to attaining the critical path lengths mentioned above.

The present invention is directed to an improved transmission or delivery system that overcomes the aforementioned disadvantages and which operates at higher speeds.

SUMMARY OF THE INVENTION

The present directed is therefore directed to an improved transmission structure that overcomes the aforementioned disadvantages and utilizes grouped electrically conductive elements to form a unitary mechanical structure that provides a complete electronic transmission channel that is similar in one sense to a fiber optic system. The focus of the invention is on providing a complete, copper-based electronic transmission channel rather than utilizing either individual conductive pins or separable interfaces with copper conductors as the transmission channel, the transmission channels of the invention yielding more predictable electrical performance and greater control of operational characteristics. Such improved systems of the present invention are believed to offer operating speeds for digital signal transmission of up to at least 12.5 GHz at extended path lengths which are much greater than 0.25 inch.

Accordingly, it is a general object of the present invention to provide an engineered waveguide that functions as a grouped element channel link, where the link includes an elongated dielectric body portion and at least two conductive elements disposed along the exterior surface thereof.

Another object of the present invention is to provide a high-speed channel link (or transmission line) having an elongated body portion of a given cross-section, the body portion being formed from a dielectric with a selected dielectric constant, and the link having, in its most basic structure, two conductive elements disposed on the exterior surface thereof, the elements being of similar size and shape and oriented thereon, in opposition to each other, so as to steer the electrical energy wave traveling through the link by establishing particular electrical and magnetic fields between the two conductive elements and maintaining these fields throughout the length of the channel link.

A further object of the present invention is to control the impedance of the channel link by selectively sizing the conductive elements and the gaps therebetween on the exterior surface of the elongated body to maintain balanced or unbalanced electrical & magnetic fields.

Yet another object of the present invention is to provide a improved electrical transmission channel that includes a flat substrate, and a plurality of grooves formed in the substrate, the grooves having opposing sidewalls and the grooves being spaced apart by intervening lands of the substrate, the sidewalls of the grooves having a conductive material deposited thereon, such as by plating or deposition, to form electronic transmission channels within the grooves, or the conductive material being disposed as metal strips, metal inlays or adhered metal on opposite sidewalls of the grooves.

A still further object of the present invention is to provide a pre-engineered wave guide in which at least a pair of conductive elements are utilized to provide differential signal transmission, i.e., signal in ("+") and signal out ("−"), the pair of conductive elements being disposed on the exterior of the dielectric body so as to permit the establishment of capacitance per unit length, inductance per unit length, impedance, attenuation and propagation delay per unit length, and establishing these pre-determined performance parameters within the channels formed by the conductive elements.

A yet further object of the present invention is to provide an improved transmission line in the form of a solid link, of preferably uniform, circular cross-section, the link including at least a pair of conductive elements disposed thereon that serve to guide the electrical wave therethrough, the link including at least one thin filament of dielectric material having two conductive surfaces disposed thereon, the conductive surfaces extending lengthwise of the filament and separated by two circumferential arcuate extents, the conductive surfaces further being separated from each other to form a discrete, two-element transmission channel that reduces the current loop and in which the signal conductors are more tightly aligned.

Yet another object of the present invention is to provide a non-circular transmission line for high speed applications, which includes an elongated rectangular or square dielectric member having an exterior surface with at least four distinct sectors disposed thereon, the dielectric member including a pair of conductive elements aligned with each other and disposed on two of the sectors, while separated by an intervening sector.

The present invention accomplishes the above and other objects by virtue of its unique structure. In one principal aspect, the present invention includes a transmission line that is formed from a dielectric with a preselected dielectric constant and a preselected cross-sectional configuration. A pair of conductive surfaces are disposed on the dielectric line, or link, and one preferably aligned with each other and separated from each other. The conductive surfaces serve as wave guides for guiding electrical energy along the transmission link.

In another principal aspect of the present invention, the conductive elements are grouped together as a pair on a single element, thus defining a unitized wave guide that may be run between and among successive printed circuit boards and connected thereto without difficulty. The conductive surfaces may be formed by selectively depositing conductive material thereon, such as by plating, the exterior surface of the dielectric body, or by molding or otherwise attaching an actual conductor to the body. In this manner, the dielectric may be formed with bends and the conductive surfaces that exist on the surface thereof maintains their spaced apart arrangement of grouped channel conductors along and throughout the bends of the dielectric body.

In yet another principal aspect of the invention, the exterior of the transmission line may be covered by a protective outer jacket, or sleeve. The conductive surfaces may be disposed on the dielectric body in a balanced arrangement with equal widths, or an unbalanced arrangement with one or more pairs of conductive elements, and the conductive elements having different widths. Three conductive elements may be disposed on the dielectric body to support a differential triple on the transmission line utilizing a pair of differential signal conductors and an associated ground conductor. The number of conductive surfaces is limited only by the size of the dielectric body, and four such discrete conductive elements may be used to support two different signal channels or a single differential pair with dual grounds.

In still another principal aspect of the present invention, a unitary transmission line is formed within one cavity, or within a plurality of selectively-sized metallized cavities are formed within a substrate. The substrate is grooved to form the cavities and the sidewalls of the grooves may be plated with a conductive material. The air gap between the sidewalls of the cavities, or grooves, in this instance, serves as the dielectric of the transmission channel. In this structure, the dielectric constant of air is different and less than the dielectric constant of the dielectric body so as to influence signal propagation rate, while electrical affinity and particularly, coupling between the conductive elements in the grooves and not between adjacent signal transmission channels of the transmission line is controlled by geometry and material, while increasing transmission speed.

In yet another principal aspect of the present invention, the aforementioned transmission links may be used to carry power. In such circumstances, the underlying transmission line will include a grooved dielectric, with a continuous contact region being formed within the grooves, i.e., covering the sidewalls and bases of the groove. The continuous contact area that is present on these three surfaces for the length of the groove extends the current carrying capability of the structure. A ground plane may be utilized to increase capacitive coupling among the power channels and the ground plane to reduce the source impedance of the overall structure. The transmission line may be formed with projecting ridges, or lands, that serve to define troughs there between. The conductive surfaces are formed in the troughs by way of a continuous process, such as selective plating, so that a continuous plated trough, i.e., two sidewalls and an interconnecting base are formed which extend for the length of the transmission line. This increases the current carrying capability of the transmission line. A high capacitance may then be created across the dielectric between two signal conductors to reduce the source impedance of the system.

In a slot transmission line, the opposing sidewalls of a slot or groove through a substrate, can be plated with a conductive material to form continuous contacts that extend the length of the transmission line and opposite polarity signals (i.e., "+" and "−") may be carried along these contacts. High-frequency signals on the conductive material can be confined as well as shielded from electromagnetic interference by a virtual shield around the conductors embodied by several conductive vias alongside the conductors. In addition, ground conductors below the conductors and on the surface of the substrate provide further shielding.

The transmission lines of the invention may carry both signals and power and thus may be easily divided into separate signal channels and power channels. The signal channels may be made with conductive strips or paths of a pre-selected width, while the power channels, in order to carry high currents, may include either wider strips or an enlarged, continues conductor strip. The wider strips are enlarged plate areas as compared to the signal strips and have a high capacitance. The signal and power channels may be separated by a wide, non-conductive area of the transmission line that serves as an isolation region. Because the isolation region may be formed during the forming of the underlying dielectric base, the isolation region may be readily defined to minimize cross-contamination or electrical interference.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 5 is a schematic end view of the grouped element channel link of FIG. 4 illustrating the arcuate extents of the conductive elements and the spacing there between;

FIG. 9 is a perspective view of an alternate construction of a link of the invention with a right angle bend formed therein;

FIG. 10 is a schematic view of a transmission line utilizing the links of the present invention;

FIG. 11 is a perspective view illustrating alternate media compositions of the links of the invention;

DETAILED DESCRIPTION OF THE PREFERRED EMBODIMENTS

Figure 1:
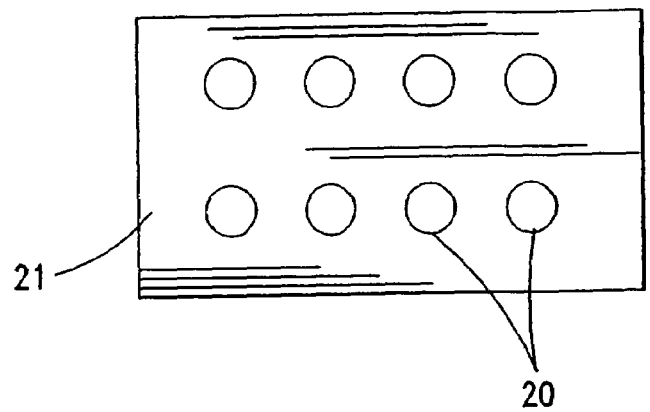
FIG. 1 is a schematic plan view of the terminating face of a conventional connector.
Figure 2:
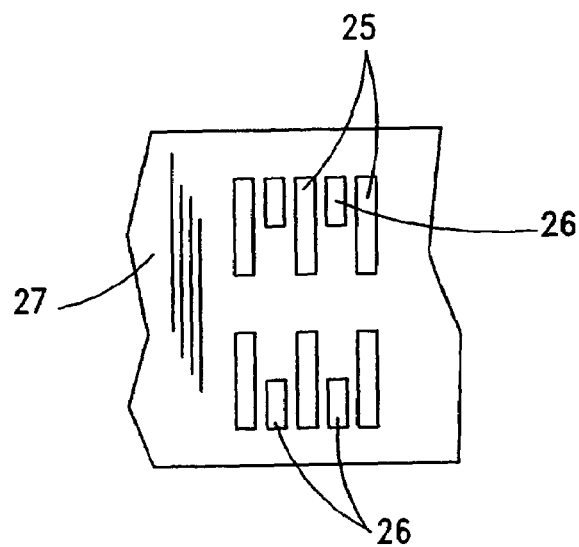
FIG. 2 is a schematic plan view of an edge card used in a high speed connector.
Figure 3:
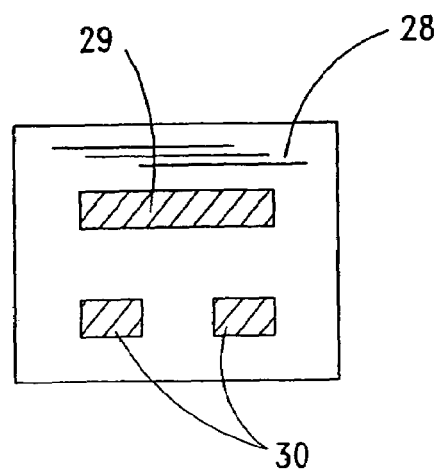
FIG. 3 is a schematic elevational view of a high speed connector utilizing a triad or triple.
Figure 4:
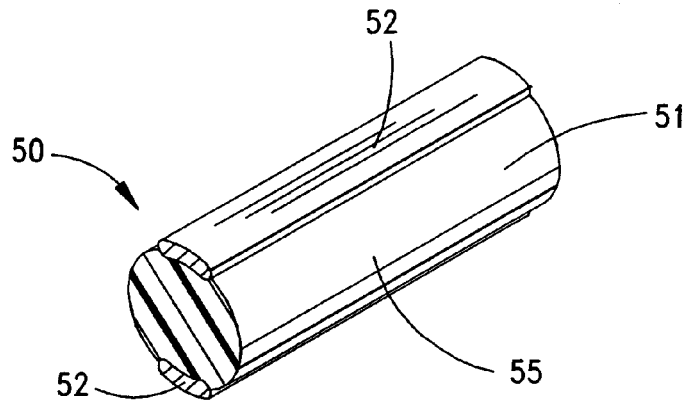
FIG. 4 is a perspective view of a grouped element channel link constructed in accordance with the principles of the present invention.

FIG. 4 illustrates a grouped element channel link 50 constructed in accordance with the principles of the present invention. It can be seen that the link 50 includes an elongated, dielectric body 51, preferably a cylindrical filament, that is similar to a length of fiber optic material. It differs therefrom in that the link 50 acts as a pre-engineered wave guide and a dedicated transmission media. In this regard, the body 51 is formed of a dedicated dielectric having a specific dielectric constant and a plurality of conductive elements 52 applied thereto.

Figure 5:
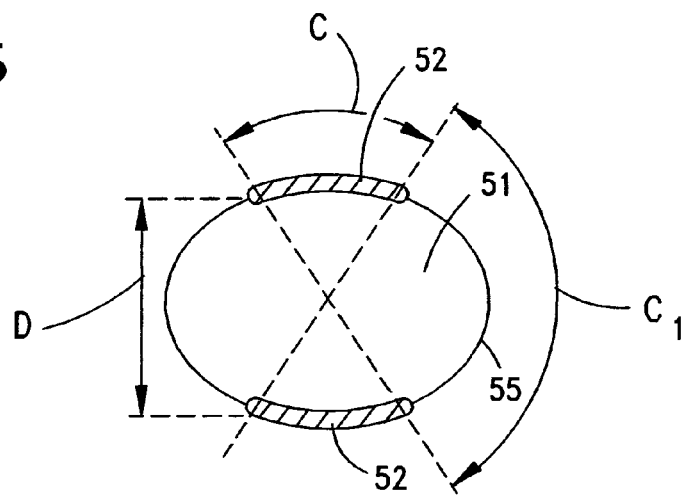

In FIGS. 4 and 5, the conductive elements 52 are illustrated as elongated extents, traces or strips, 52 of conductive material and, as such, they may be traditional copper or precious metal extents having a definite cross-section that may be molded or otherwise attached, such as by adhesive or other means to the dielectric body of the link 50. They may also be formed on the exterior surface 55 of the body 51 such as by a suitable plating or vacuum deposition process. The conductive traces 52 are disposed on the exterior surface and have a width that extends along the perimeter of the dielectric body.

Figure 29:
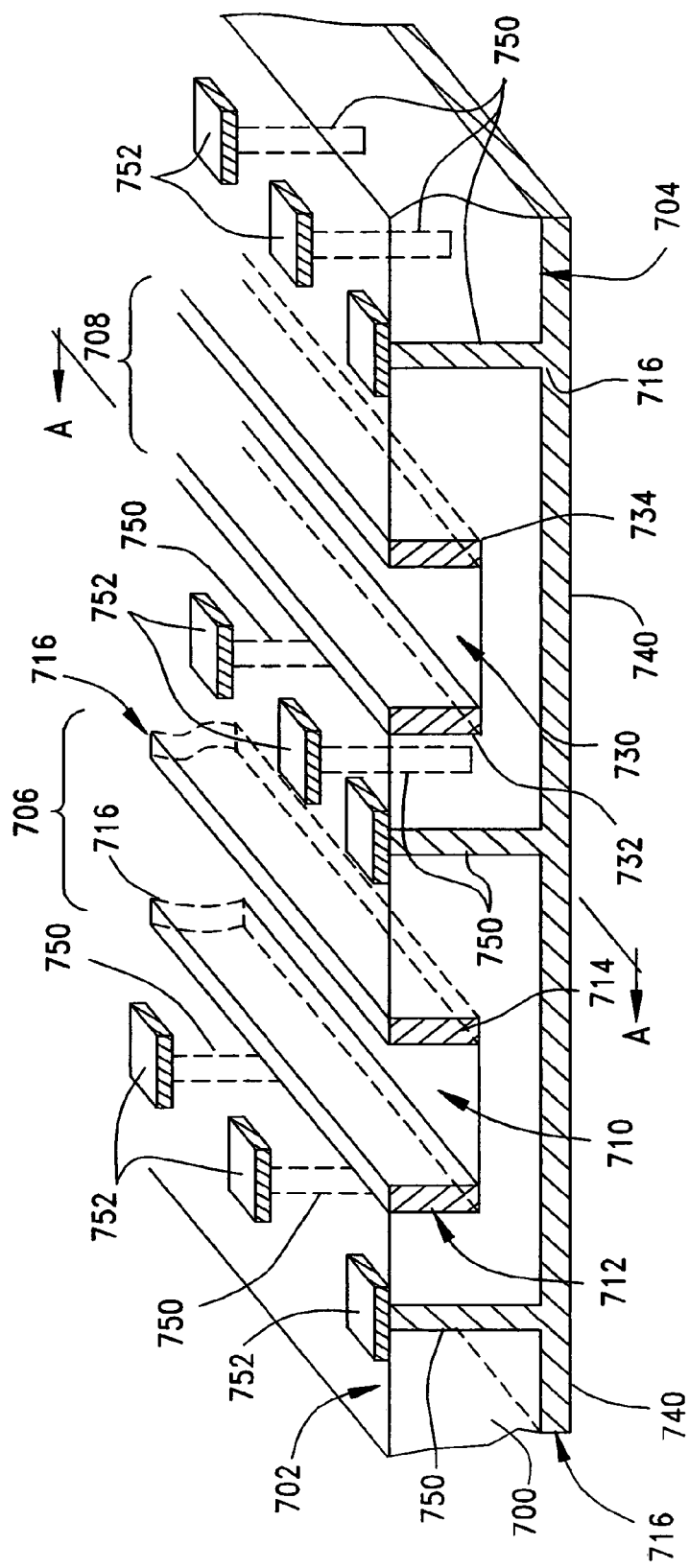
FIG. 29 is a perspective view of electro-magnetically shielded slot transmission lines in a dielectric substrate.
Figure 30:
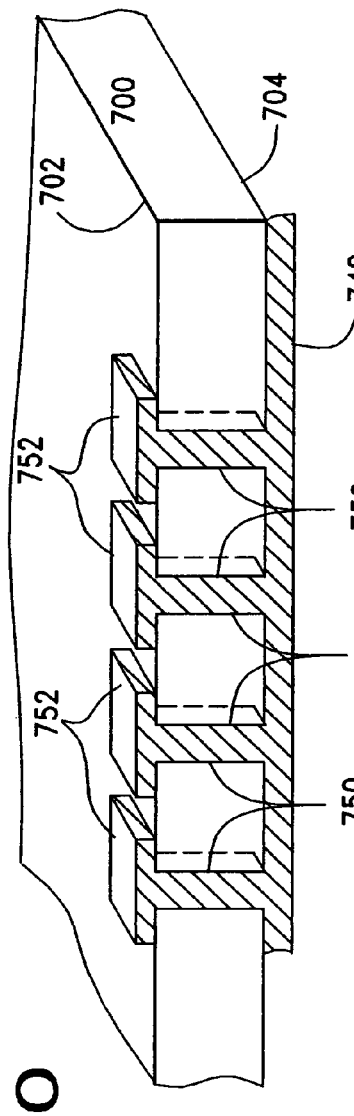
FIG. 30 is a sectional view of the substrate shown in FIG. 29 depicting the shielding structures; and, FIG. 31 is an end-view of an alternate embodiment of electro-magnetically shielded slot transmission lines.

At least two such conductors are used on each link, typically are used for signal conveyance of differential signals, such as +0.5 volts and −0.5 volts. The use of such a differential signal arrangement permits us to characterize structures of this invention as pre-engineered waveguides that are maintained over substantially the entire length of the signal delivery path. The use of the dielectric body 51 provides for preferred coupling to occur within the link. In the simplest embodiment, as illustrated in FIG. 5, the conductive elements are disposed on two opposing faces, so that the electrical affinity of each of the conductive elements is for each other through the dielectric body upon which they are supported, or in the case of a conductive channel as will be explained in greater detail to follow and as illustrated in FIGS. 29–30, the conductive elements are disposed on two or more interior faces of the cavity/cavities to establish the primary coupling mode across the cavity gap and through an air dielectric. In this manner, the links of the present invention may be considered as the electrical equivalent to a fiber optic channel or extent.

The present invention is directed to electrical waveguides. The waveguides of the present invention are intended to maintain electrical signals at desired levels of electrical affinity at high frequencies from about 1.0 Ghz to at least 12.5 Ghz and preferably higher. Optical waveguides, as described in U.S. Pat. No. 6,377,741, issued Apr. 23, 2002, typically rely upon a single outer coating, or cladding, having mirror-like reflective properties to maintain the light energy moving in a selected direction. Openings in the outer coating/cladding will result in a dispersal of the light traveling through the waveguide, which adversely affects the light beam of the waveguide. Microwave waveguides are used at very high frequencies to direct the energy of the microwave beam, rather than transmit it as exemplified by U.S. Pat. No. 6,114,677, issued Sep. 5, 2002 in which a microwave waveguide is used to direct the microwaves at the center portion of an oven. Such a directional aim is also utilized the microwave antenna art. In each instance, these type of waveguides are used to focus and direct the energy of the light of microwave traveling through them, whereas in the present invention, the entire waveguide structure is engineered to maintain an electrical signal at desired frequency(ies) and impedance, capacitance and inductance.

The effectiveness of the links of the present invention are dependent upon the guiding and maintenance of digital signals through the channel link, by utilizing two or more conductive surfaces of electrical containment. This will include maintaining the integrity of the signal, controlling the emissions and minimizing loss through the link. The channel links of the present invention contain the electromagnetic fields of the signals transmitted therethrough by controlling the material of the channel link and the geometries of the system components so that preferred field coupling will be provided. Simply stated, the present invention creates an engineered transmission line by defining a region of electrical affinity, i.e., the dielectric body 51, that is bounded by conductors, i.e., conductive surfaces 52, of opposing charge, i.e., negative and positive differential signals.

As illustrated better in FIG. 5, the two conductive surfaces 52 are arranged on the dielectric body 51 in opposition to each other. The dielectric body 51 shown in FIG. 4 takes the form of a cylindrical rod, while the dielectric body shown in FIG. 5 has an oval-like configuration. In each such instance, the conductive surfaces or traces 52, extend for distinct arc lengths. Both FIGS. 4 and 5 are representative of a "balanced" link of the invention where the circumferential extent, or arc length C of the two conductive surfaces 52 is the same, and the circumferential extents or arc lengths C1 of the non-conductive exterior surfaces 55 of the dielectric body 51 are also the same. This length may be considered to define a gross separation D between the conductive surfaces. As will be explained below, the link may be "unbalanced" with one of the conductive surfaces having an arc length that is greater than the other, and in such an instance, the transmission line is best suited for single-ended, or non-differential signal applications. In instances where the dielectric body and link are circular, the link may serve as a channel contact pin and so be utilized in connector applications. This circular cross-section demonstrates the same type of construction as a conventional round contact pin.

Figure 6:
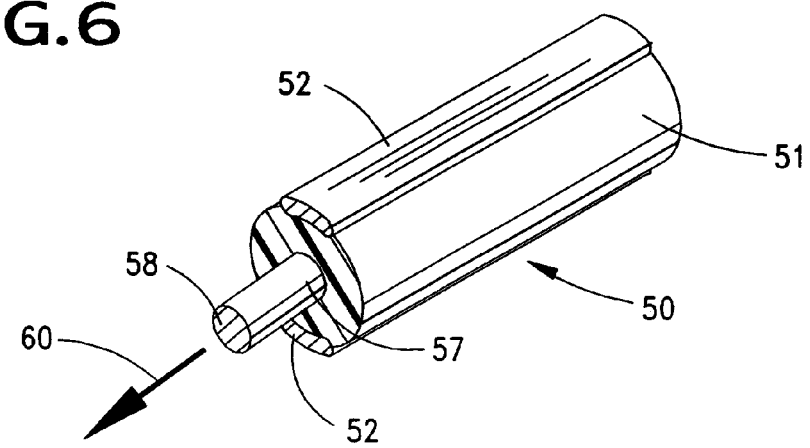
FIG. 6 is a perspective view of an alternate embodiment of a grouped element channel link constructed in accordance with the principles of the present invention.

As illustrated in FIG. 6, the links of the present invention may be modified to provide not only multiple conductive elements as part of the overall system transmission media, but may also incorporate a coincident and coaxial fiber optic wave guide therewithin for the transmission of light and optical signals. In this regard, the dielectric body 51 is cored to create a central opening 57 through which an optical fiber 58 extends. Electrical signals may be transmitted through this link as well as light signals 60.

Figure 7:
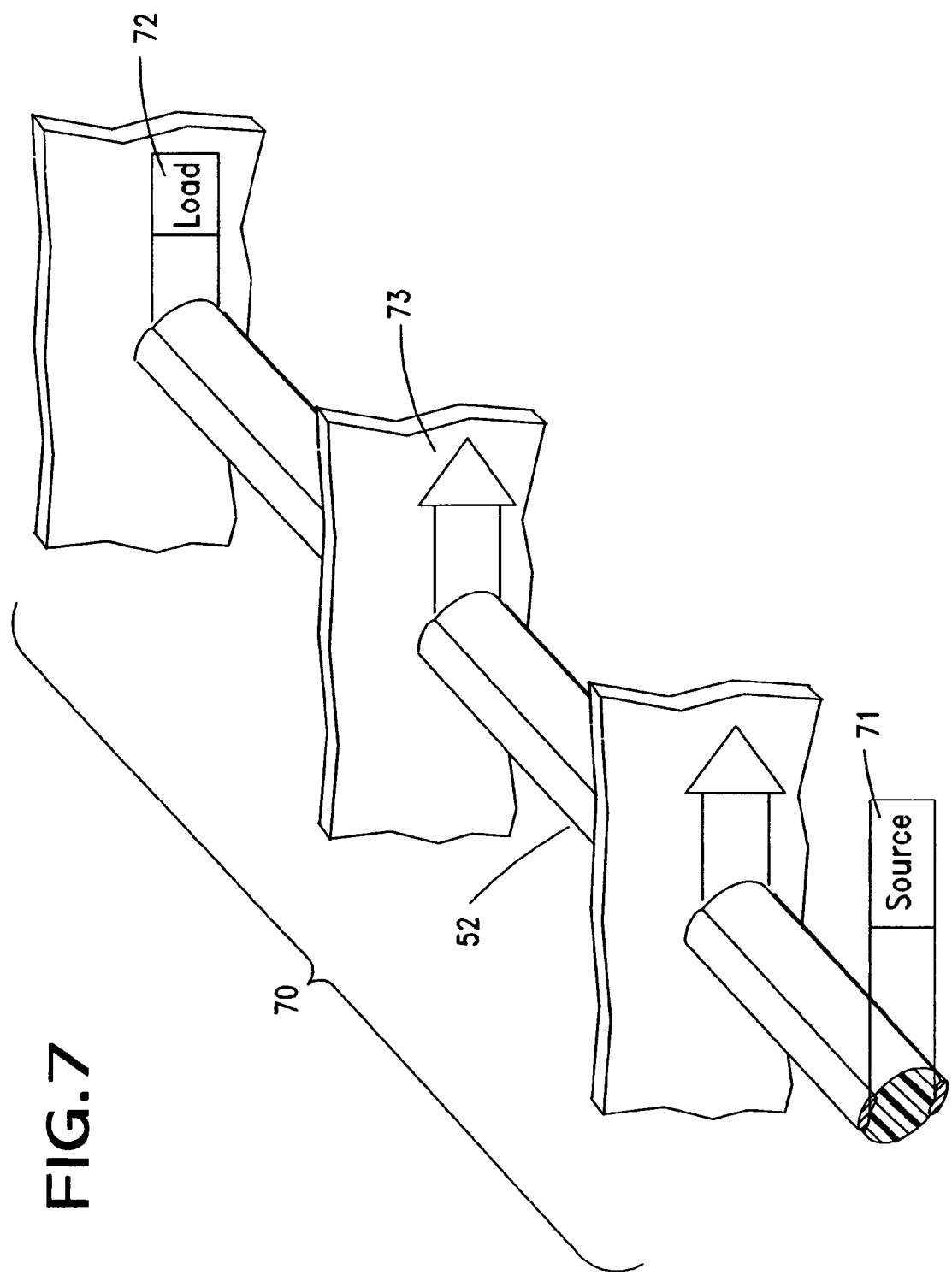
FIG. 7 is a schematic view of a transmission link of the present invention used to connect a source with a load having intermediate loads on the transmission link.

FIG. 7 schematically illustrates a transmission line 70 incorporating a link 50 of the present invention that extends between a source 71 and a load 72. The conductive surfaces 52 of the link serve to interconnect the source and load together, as well as other secondary loads 73 intermediate the source and the load. Such secondary loads may be added to the system to control the impedance through the system. A line impedance is established at the source and may be modified by adding secondary loads to the transmission line.

Figure 8:
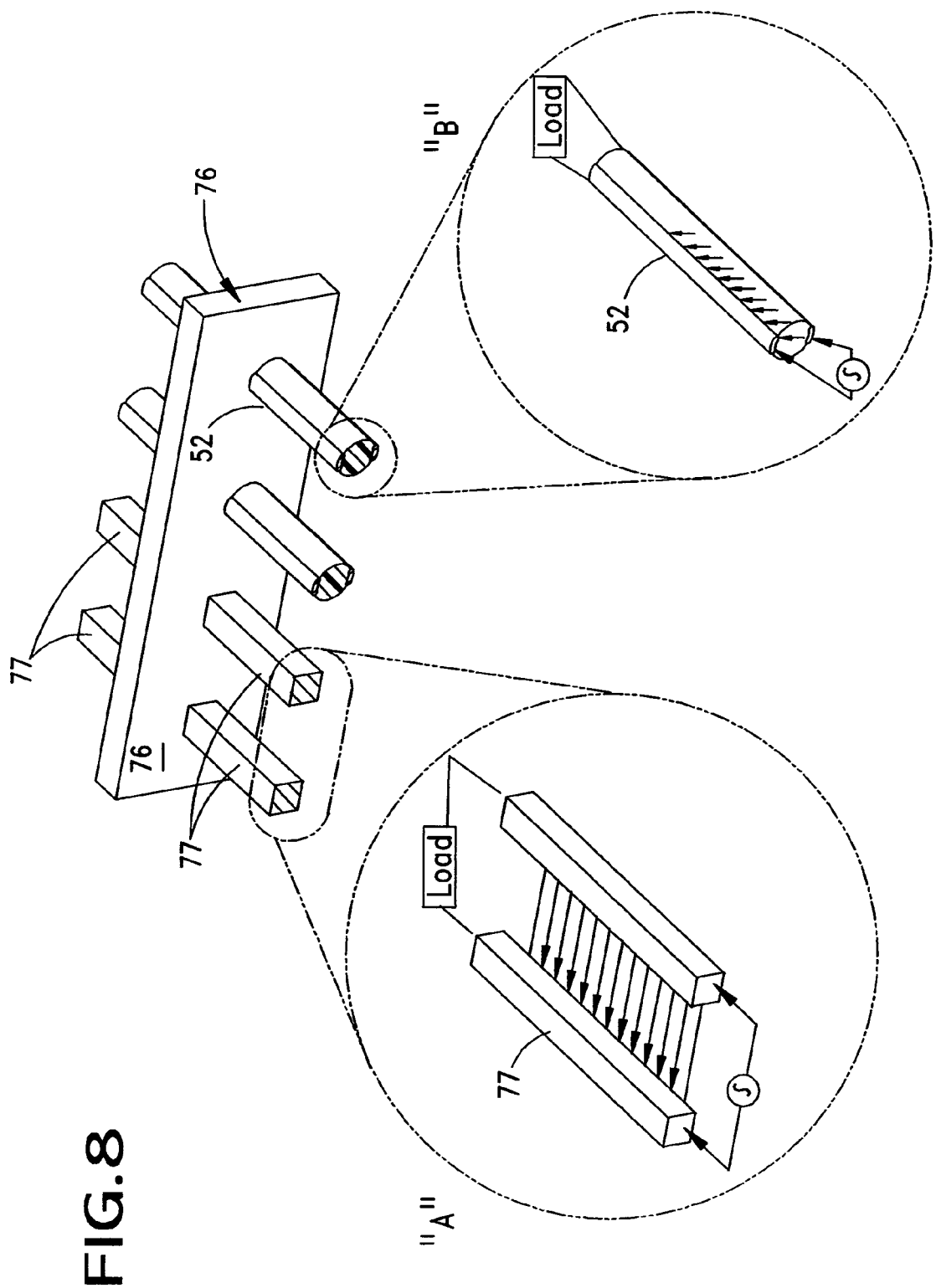
FIG. 8 is a schematic view of a connector element utilizing both conventional contacts "A" and the transmission links "B" of the invention, with enlarged detail portions at "A" and "B" thereof, illustrating the occurrence of inductance in the respective systems.

FIG. 8 illustrates, schematically, the difference between the links of the present invention and conventional conductors, which are both illustrated as supported by a dielectric block 76. Two discrete, conventional conductors 77 are formed from copper or another conductive material and extend through the block 76, in the manner of pins. As shown in enlargement "A", the two discrete conductor presents an open cell structure with a large inductance (L) because of the enlarged current loop. Quite differently, the links of the present invention have a smaller inductance (L) at a constant impedance due to the proximity of the conductive surfaces to each other as positioned as the dielectric body 51. The dimensions of these links 50 can be controlled in the manufacturing process and extrusion will be the preferred process of manufacturing with the conductive surfaces being extended with the dielectric body or separately applied of the extrusion, such as by a selective plating process so that the resulting construction is of the plated plastic variety. The volume of the dielectric body 51 and the spacing between conductive elements disposed thereon may be easily controlled such an extrusion process. The conductive surfaces preferably extend for the length of the dielectric body and may end slightly before the ends thereof at a location where it is desired to terminate the transmission line to a connector, circuit board or similar component, As FIG. 9 illustrates, the dielectric body may have a bend 80 forward therewith in the form of the 90.degree. right-angle bend illustrated or in any other angular orientation. As shown, the conductive surfaces 52 extend through the bend 80 with the same separation spacing between them and the same width with which the conductive surfaces start and end. The dielectric body 51 and the conductive surfaces 52 are easily maintained in their spacing and separation through the bend to eliminate any potential losses FIG. 10 illustrates a transmission line using the links of the invention. The link 50 is considered as a transmission cable formed from one or more single dielectric bodies 51, and one end 82 of it is terminated to a printed circuit board 83. This termination may be direct in order to minimize any discontinuity at the circuit board. A short transfer link 84 that maintains any discontinuities at a minimum is also provided. These links 84 maintain the grouped aspect of the transmission link. Termination interfaces 85 may be provided where the link is terminated to the connector with minimum geometry discontinuity or impedance discontinuity. In this manner, the grouping of the conductive surfaces is maintained over the length of the transmission line resulting in both geometric and electrical uniformity.

FIG. 11 illustrates a variety of different cross-sections of the transmission links 50 of the invention. In the rightmost link 90, a central conductor 93 is encircled by a hollow dielectric body 94 which in turn, supports multiple conductive surfaces 95 that are separated by an intervening space, preferably filled with portions of the dielectric body 94. This construction is suitable for use in power applications where power is carried by the central conductor 93. In the middle link 91 of FIG. 11, the central cover 96 is preferably made of a selected dielectric and has conductive surfaces 97 supported on it. A protective outer insulative jacket 98 is preferably provided to protect and or insulate the inner link. The leftmost link 92 of FIG. 11 has a protective outer jacket 99 that encloses a plateable polymeric ring 100 that encircles either a conductive or insulative core 101. Portions 101 of the ring 100 are plated with a conductive material and are separated by unplated portions to define the two or more conductive surfaces desired on the body of the ring. Alternatively, one or the elements surrounding the core or of the link 92 may be filled with air and may be spaced away from an inner member by way of suitable standoffs or the like.

Figure 12:
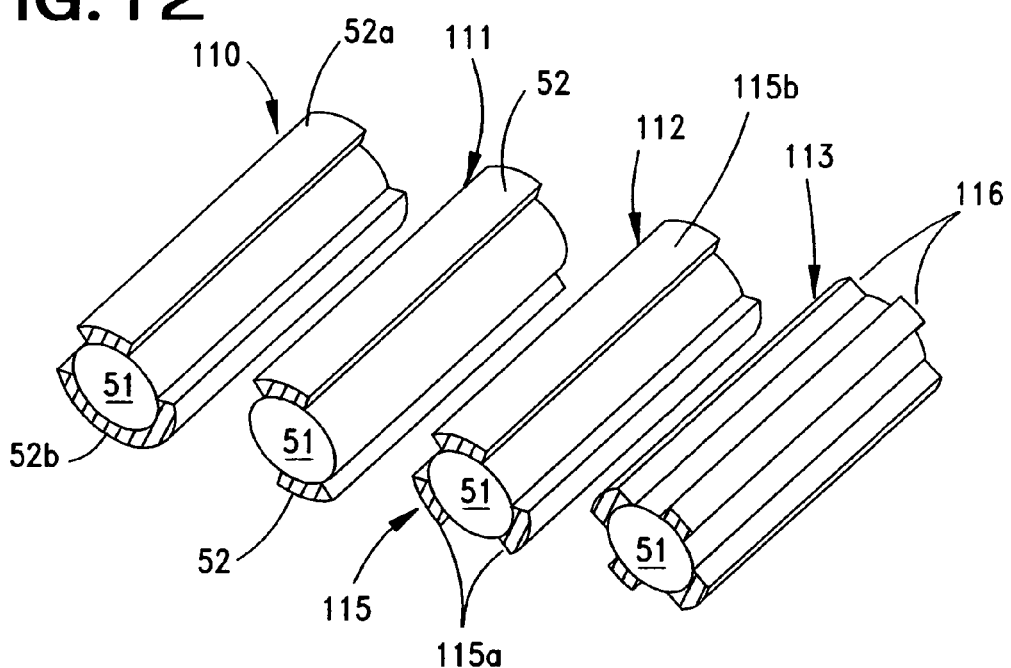
FIG. 12 is a perspective view of an array of different shapes of dielectric bodies illustrating alternate conductive surface arrangements.

FIG. 12 illustrates an array of links 110–113 that have their outer regions combined with the dielectric body 51 to form different types of transmission links. Link 110 has two conductive surfaces 52a, 52b of different arc lengths (i.e., unbalanced) disposed on the outer surface of the dielectric body 51 so that the link 110 may provide single-ended signal operation. Link 111 has two equal-spaced and sized (or "balanced") conductive elements 52 to provide an effective differential signal operation.

Link 112 has three conductive surfaces 115 to support two differential signal conductors 115a and an assorted ground conductor 115b. Link 113 has four conductive surfaces 116 disposed on its dielectric body 51 in which the conductive surfaces 116 may either include two differential signal channels (or pairs) or a single differential pair with a pair of associated grounds.

Figure 13:
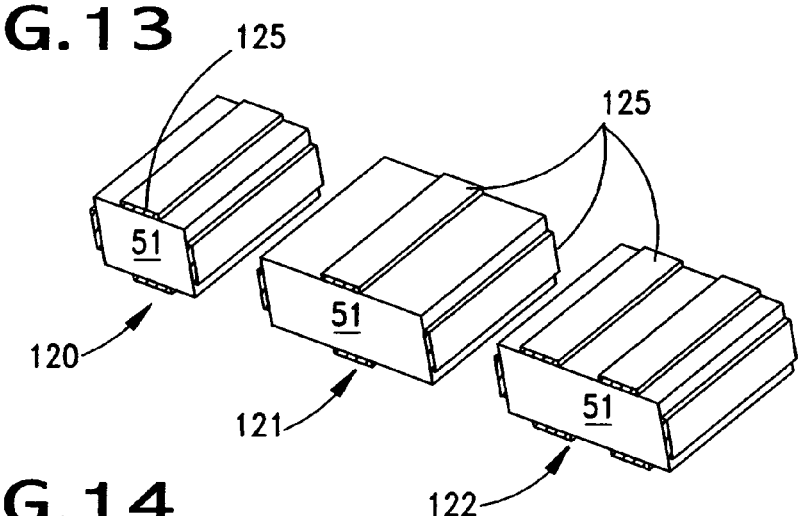
FIG. 13 is a perspective view of an array of non-circular cross-section dielectric bodies that may be used to form links of the invention.

FIG. 13 illustrates an array of one-type of non-circular links 120–122 that polygonal configurations, such as square configurations, as with link 120 or rectangular configurations as with links 121–122. The dielectric bodies 51 may be extruded with projecting land portions 125 that are plated or otherwise covered with conductive material. Individual conductive surfaces are disposed on individual sides of the dielectric body and preferably differential signal pairs of the conductive surfaces are arranged on opposing sides of the body. These land portions 125 may be used to "key" into connector slots of terminating connectors in a manner so that contact between the connector terminals (not shown) and the conductive faces 125 is easily effected.

Figure 14:
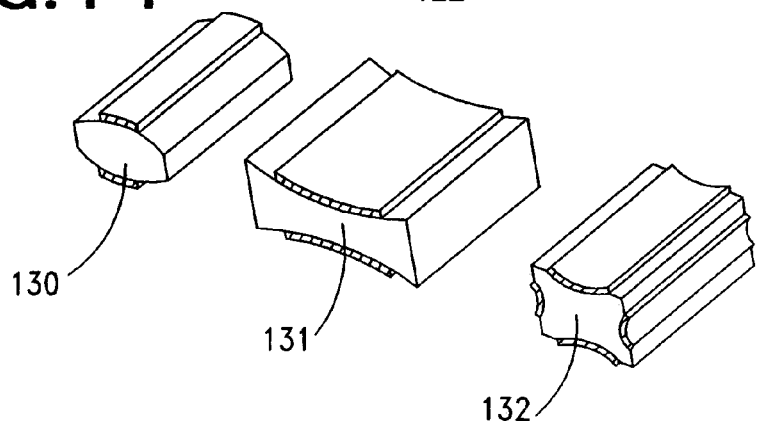
FIG. 14 is a perspective view of another array of non-circular cross-section dielectric bodies suitable for use as links of the invention.

FIG. 14 illustrates some additional dielectric bodies that may be utilized with the present invention. One body 130 is shown as convex, while the other two bodies 131, 132 are shown as being generally concave in configuration. A circular cross-section of the dielectric bodies has a tendency to concentrate the electrical field strength at the corners of the conductive surfaces, while a slightly convex form as shown in body 130, has a tendency to concentrate the field strength evenly, resulting in lower attenuation. A flat conductive surface begins to provide the most even field concentration over opposing conductive faces. The concave bodies, as illustrated by dielectric bodies 131, 132 may have beneficial crosstalk reduction aspects because it focuses the electrical field inwardly. The width or arc lengths of these conductive surfaces, as shown in FIG. 14 are less that the width or arc lengths of the respective body sides supporting them.

Importantly, the transmission link may be formed as a single extrusion 200 (FIGS. 15–16) carrying multiple signal channels thereupon, with each such channel including a pair of conductive surface 202–203. These conductive surfaces 202, 203 are separated from each other by the intervening dielectric body 204 that supports them, as well as web portions 205 that interconnect them together. This extrusion 200 may be used as part of an overall connector assembly 220, where the extrusion is received into a complementary shaped opening 210 formed in a connector housing 211. The inner walls of the openings 210 may be selectively plated, or contacts 212 may be inserted into the housing 211 to contact the conductive surfaces and provide, if necessary, surface mount or through hole tail portions.

Figure 17:
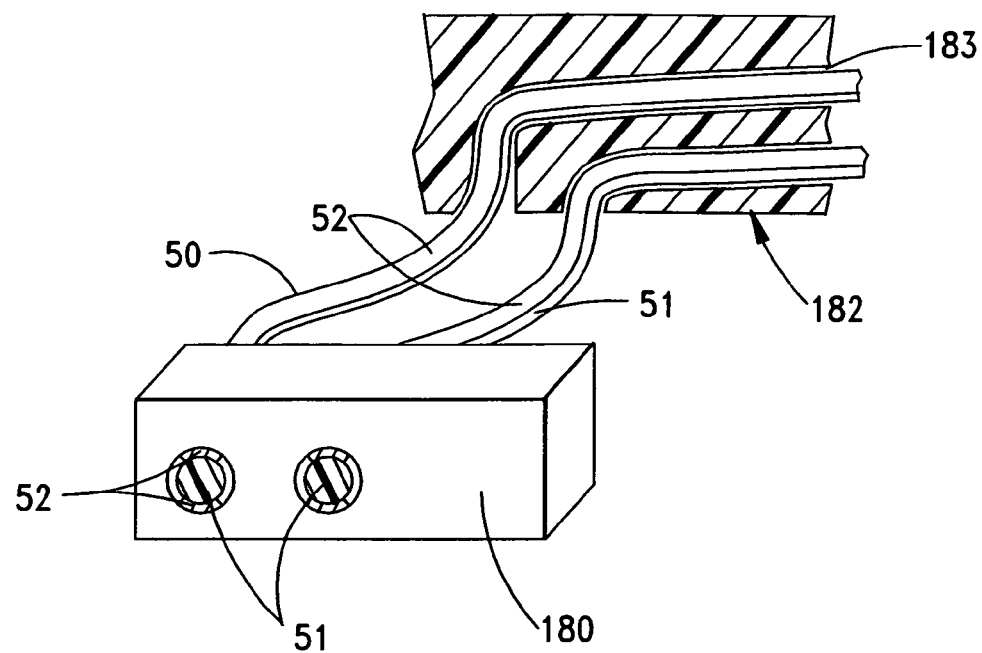
FIG. 17 is a diagrammatic view of a transmission channel of the present invention with two interconnecting blocks formed at opposite ends of the channel and illustrating the potential flexible nature of the invention.

FIG. 17 illustrates the arrangement of two transmission channels 50 arranged as illustrated and terminated at one end to a connector block 180 and passing through a right angle block 182 that includes a series of right angle passages 183 formed therein which receive the transmission channel links as shown. In arrangements such as that shown in FIG. 17, it will be understood that the transmission channel links may be fabricated in a continuous manufacturing process, such as by extrusion, and each such channel may be manufactured with intrinsic or integrated conductive elements 52. In the manufacturing of these elements, the geometry of the transmission channel itself may be controlled, as well as the spacing and positioning of the conductive elements upon the dielectric bodies so that the transmission channels will perform as consistent and unitary electronic waveguides which will support a single channel or "lane" of signal (communication) traffic. Because the dielectric bodies of the transmission channel links may be made rather flexible, the systems of the invention are readily conformable to various pathways over extended lengths without significantly sacrificing the electrical performance of the system. The one connector endblock 180 may maintain the transmission channels in a vertical alignment, while the block 182 may maintain the ends of the transmission channel links in a right angle orientation for termination to other components.

Figure 18:
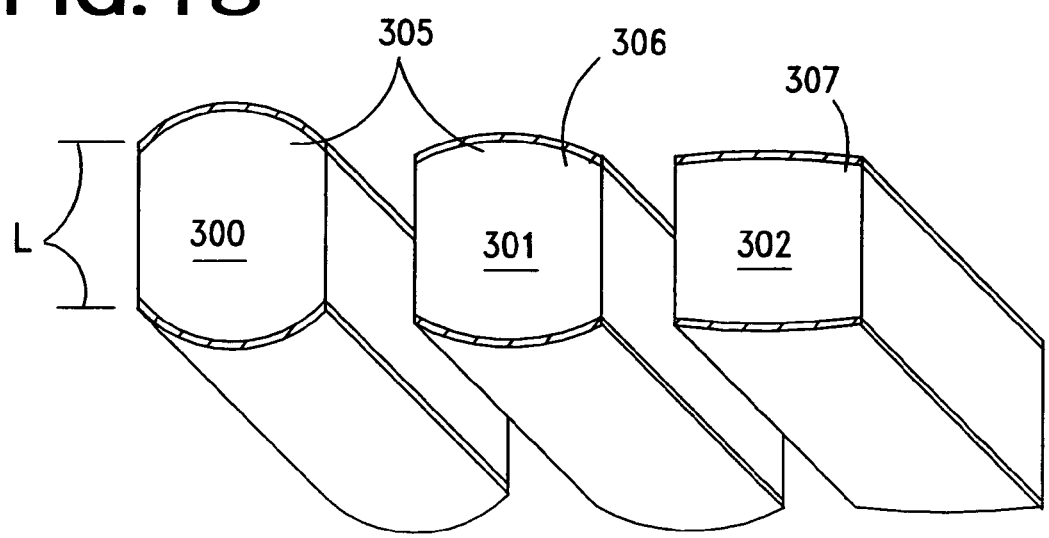
FIG. 18 is a perspective view of an array of differently configured dielectric bodies that may be used as links of the with different lens characteristics.

FIG. 18 illustrates a set of convex dielectric blocks or bodies 300–302 in which the separation distance L varies and the curve 305 of the exterior surfaces 306 of the blocks rises among the links 300–302. In this manner, it should be understood that the shapes of the bodies may be chosen to provide different lens characteristics for focusing the electrical fields developed when the conductive elements are energized.

Figure 19:
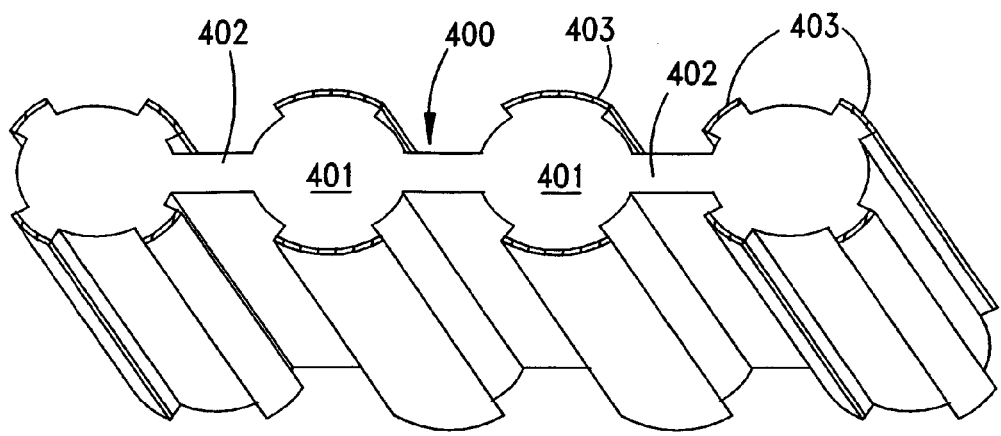
FIG. 19 is a perspective view of a multiple transmission link extrusion with different signal channels formed thereon.

FIG. 19 illustrates a multiple channel extrusion 400 with a series of dielectric bodies or blocks 401 interconnected by webs 402 in which the conductive surfaces 403 are multiple or complex in nature. As with the construction shown in FIG. 13, such an extrusion 400 supports multiple signal channels, with each of the channels preferably including a pair of differential signal conductive elements.

Figure 16:
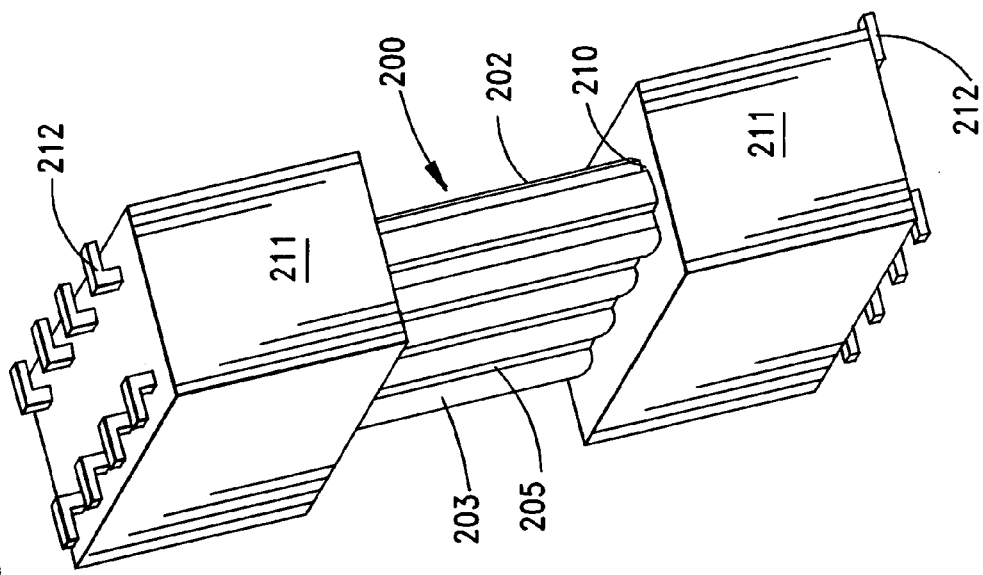
FIG. 16 is a perspective view of a connector assembly having two connector housings interconnected by the transmission link of FIG. 15.
Figure 15:
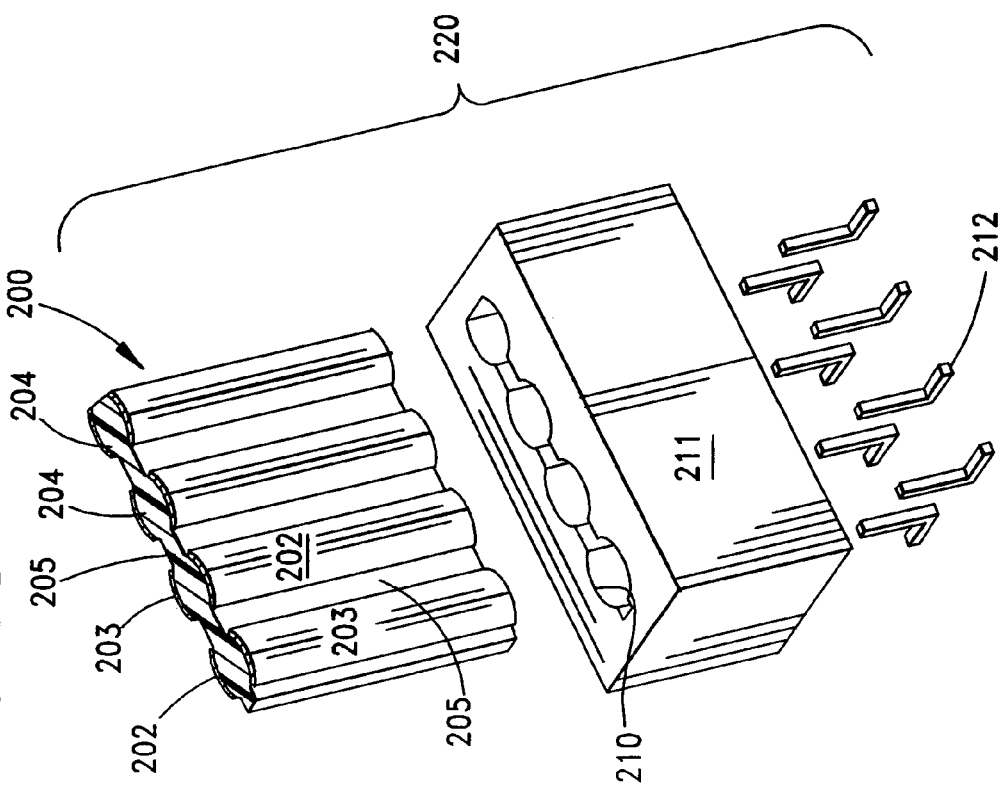
FIG. 15 is an exploded view of a connector assembly incorporating a multiple element link of the invention that is used to provide a transmission line between two connectors.
Figure 20:
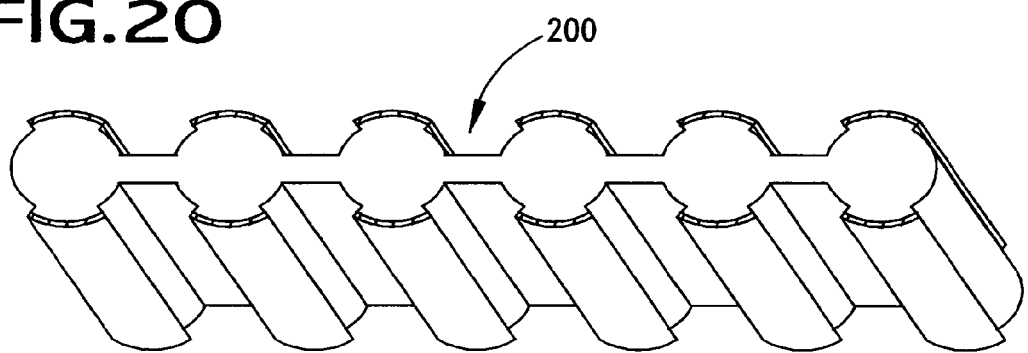
FIG. 20 is a perspective view of a multiple transmission link extrusion used in the invention.

FIG. 20 illustrates a standard extrusion 200 such as that shown in FIGS. 15 and 16.

Figure 21:
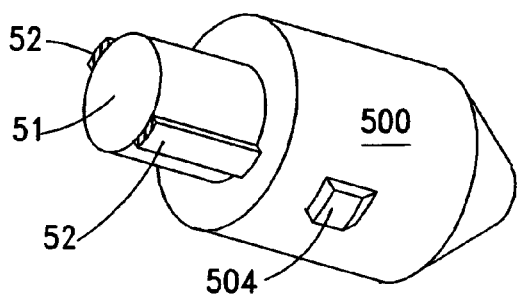
FIG. 21 is a perspective view of a mating interface used with a discrete transmission link of the invention, in which mating interface takes the form of a hollow endcap.
Figure 22:
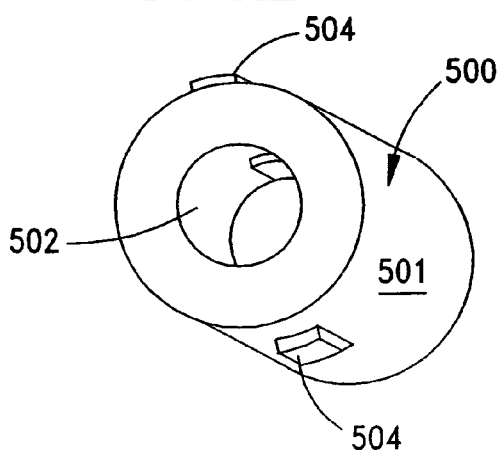
FIG. 22 is a rear perspective view of the endcap of FIG. 21, illustrating the center opening thereof that receives an end portion of the transmission link therein.
Figure 23:
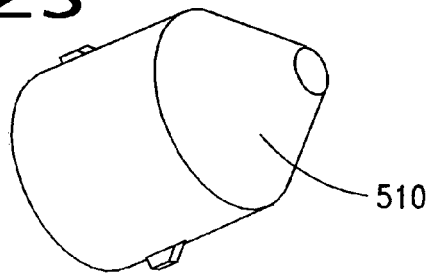
FIG. 23 is a frontal perspective view of the endcap of FIG. 21, illustrating the orientation of the exterior contacts.

The links of the present invention may be terminated into connector and other housings. FIGS. 21–23 illustrate one termination interface as a somewhat conical endcap which has a hollow body 501 with a central openings 502. The body may support a pair of terminals 504 that mate with the conductive surfaces 52 of the dielectric body 51. The endcap 500 may be inserted into various openings in connector housings or circuit boards and as such, preferably includes a conical insertion end 510. The endcap 500 may be structured to terminate only a single transmission line as is illustrated in FIGS. 21–23, or it may be part of a multiple termination interface and terminate multiple distinct transmission lines as illustrated in FIGS. 24 and 25.

Figure 24:
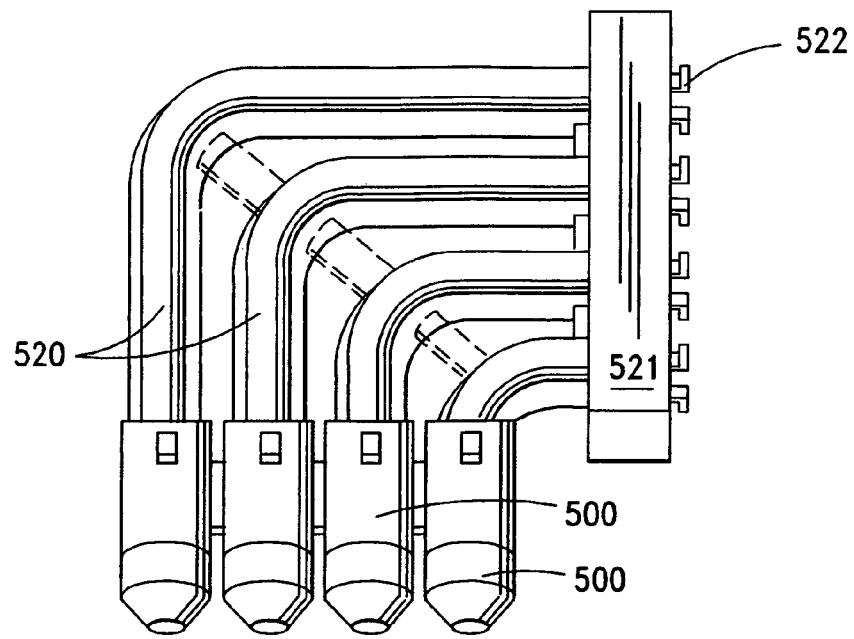
FIG. 24 is a plan view of a multiple transmission link right angle, curved connector assembly.

FIG. 24 illustrates the endcaps 500 in place on a series of links 520 that are terminated to an endblock 521 that has surface mount terminals 522 so that the endblock 521 may be attached to a circuit board (not shown). The endcap need not take the conical structure shown in the drawings, but may take other shapes and configurations similar to that shown and described below.

Figure 25:
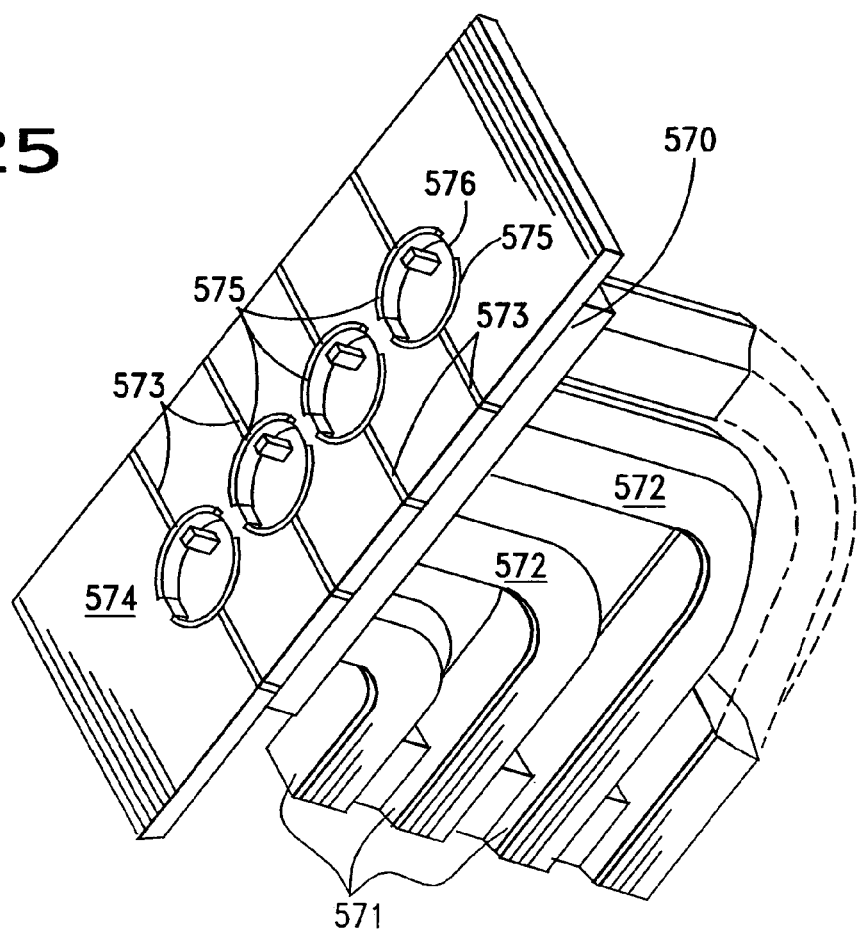
FIG. 25 is a perspective view of an alternate construction of one of the termination ends of the connector assembly.

FIG. 25 illustrates an alternate construction of an end block 570. In this arrangement, the transmission lines, or links 571, are formed from a dielectric and include a pair of conductive extents 572 formed on their exterior surfaces (with the extents 572 shown only on one side for clarity and their corresponding extents being formed on the surfaces of the links 571 that face into the plane of the paper of FIG. 25). These conductive extents 572 are connected to traces 573 on a circuit board 574 by way of conductive vias 575 formed on the interior of the circuit board 574. Such vias may also be constructed within the body of the end block 570, if desired. The vias 575 are preferably split as shown and their two conductive sections are separated by an intervening gap 576 to maintain separation of the two conductive transmission channels at the level of the board.

Figure 26:
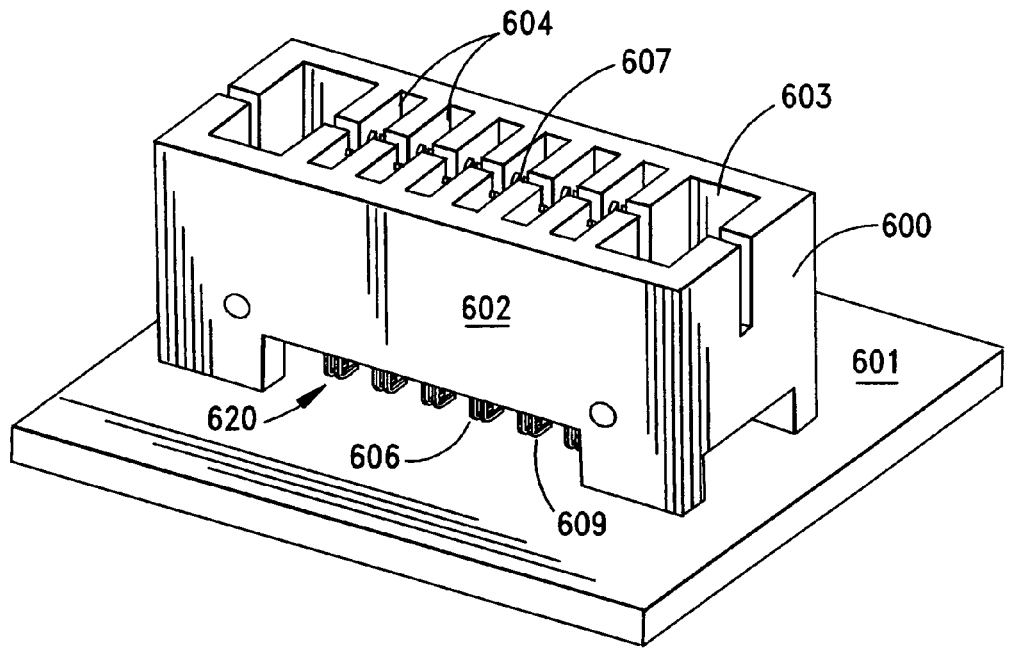
FIG. 26 is a perspective view of a connector suitable for use in connecting transmission channel links of the present invention to a circuit board.

FIG. 26 illustrates an endcap, or block 600 mounted to a printed circuit board 601. This style of endcap 600 serves as a connector and thus includes a housing 602, with a central slot 603 with various keyways 604 that accept projecting portions of the transmission link. The endcap connector 600 may have a plurality of windows 620 for access to soldering the conductive tail portions 606 of the contacts 607 to corresponding opposing traces on the circuit board 601. In instances of surface mount tails a shown, the tails 606 may have their horizontal parts 609 tucked under the body of the endcap housing to reduce the circuit board pad size needed, as well as the capacitance of the system at the circuit board.

Figure 27A:
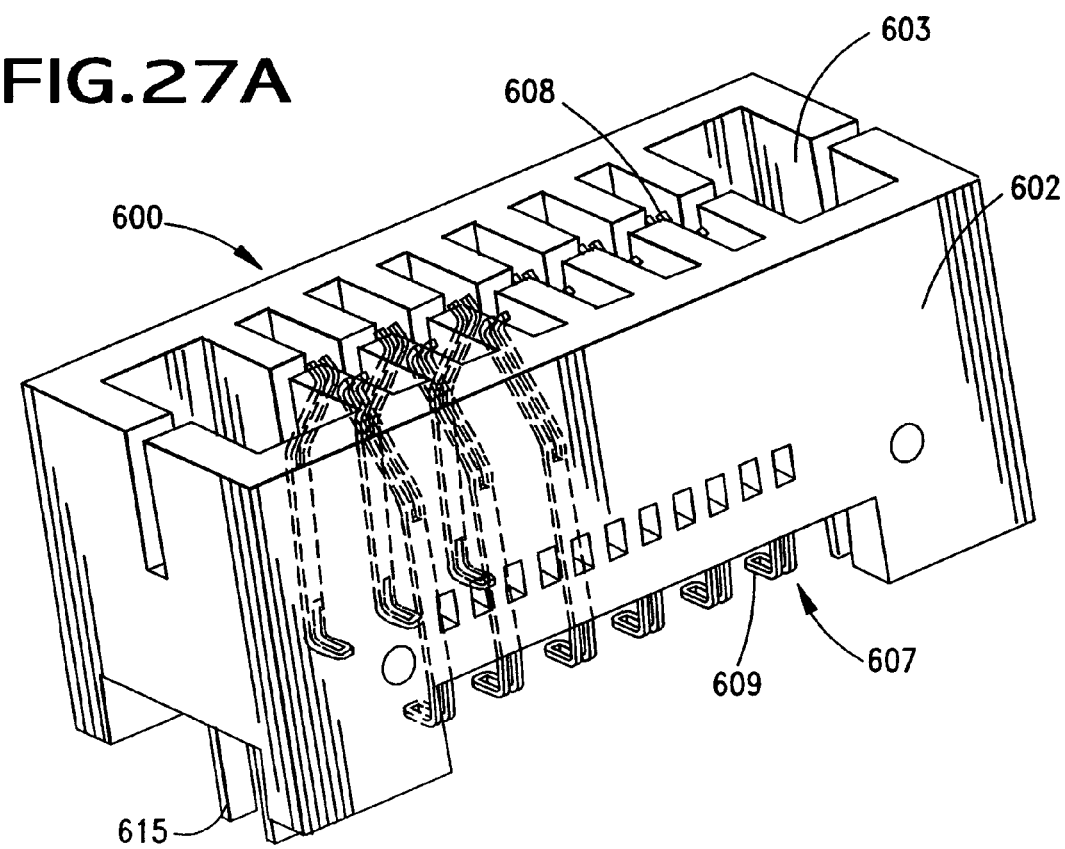
FIG. 27A is a skeletal perspective view of the connector of FIG. 26 illustrating, in phantom, some of the internal contacts of the connector.
Figure 27B:
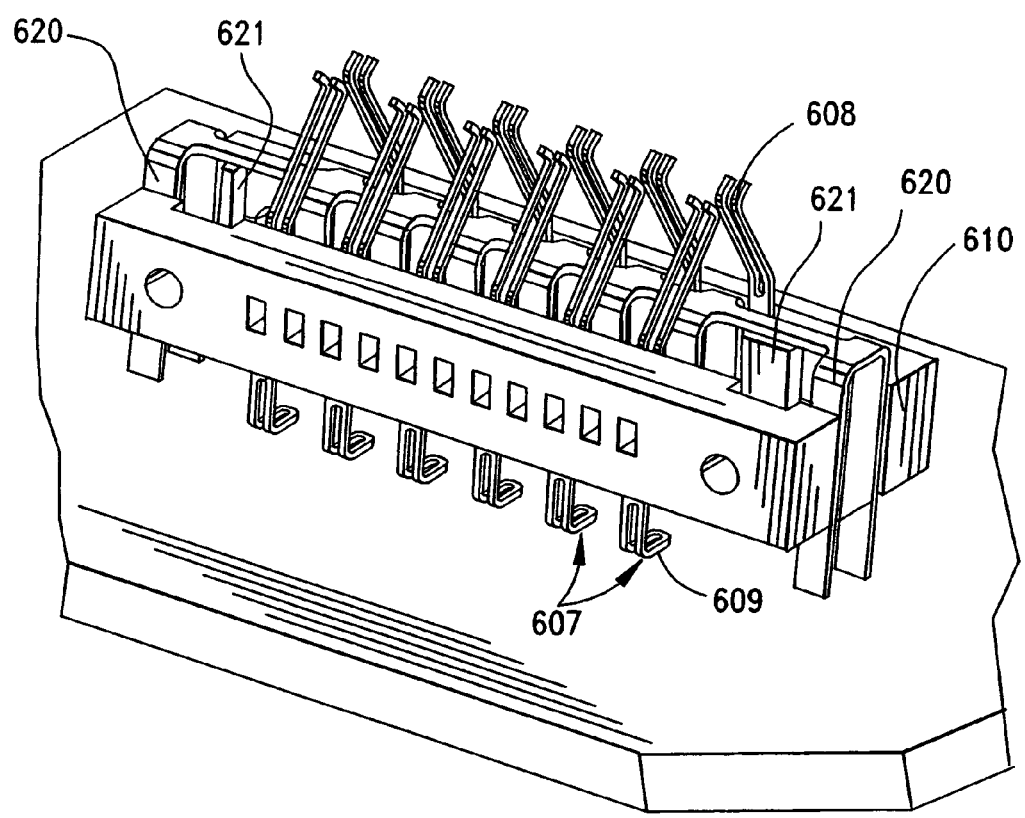
FIG. 27B is a perspective view of the interior contact assembly of the connector of FIG. 27A, with the sidewalls removed and illustrating the structure and placement of the coupling staple thereon.

FIG. 27A illustrates a partial skeletal view of the endcap connector 600 and shows how the contacts, or terminals 607 are supported within and extend through the connector housing 602. The terminals 607 may include a dual wire contact end 608 for redundancy in contact (and for providing a parallel electrical path) and the connector 600 may include a coupling staple 615 that has an inverted U-shape and which enhances coupling of the terminals across the housing. The coupling staple 615 can be seen to have an elongated backbone that extends lengthwise through the connector housing 602. A plurality of legs that are spaced apart from each other by spaces along the length of the coupling staple extend down toward the circuit board and each such leg has a width that is greater than a corresponding width of the terminal that it opposes. As shown in the drawings, the coupling staple legs are positioned in alignment with the terminals. The tail portions of these dual wire terminals 607 enhance the stability of the connector. In this regard, it also provides control for the terminals that constitute a channel (laterally) across the housing slot 601. The dual contact path not only provides for path redundancy but also reduces the inductance of the system through the terminals. FIG. 27B is a view of the interior contact assembly that is used in the endcap connector 600 of FIGS. 26 and 27A. The terminals 607 are arranged on opposite sides of the connector and are mounted within respective support blocks 610. These support blocks 610 are spaced apart from each other a preselected distance that assists in spacing the terminal contacts 608 apart.

A conductive coupling staple 615 having an overall U-shape, or blade shape, may be provided and may be interposed between the terminals 607 and support blocks 610 to enhance the coupling between and among the terminals 607. The coupling staple 615 has a series of blades 620 that are spaced apart by intervening spaces 621 and which are interposed between pairs of opposing contacts (FIG. 28) 6087 and which extend downwardly toward the surface of the circuit board. The staple 615 extends lengthwise through the connector body between the connector blocks 610. The connector blocks 610 and the connector housing 602 (particularly the sidewalls thereof) may have openings 616 formed therein that receive engagement plugs 617 therein to hold the two members in registration with each other. Other means of attachment may be utilized, as well.

Figure 28:
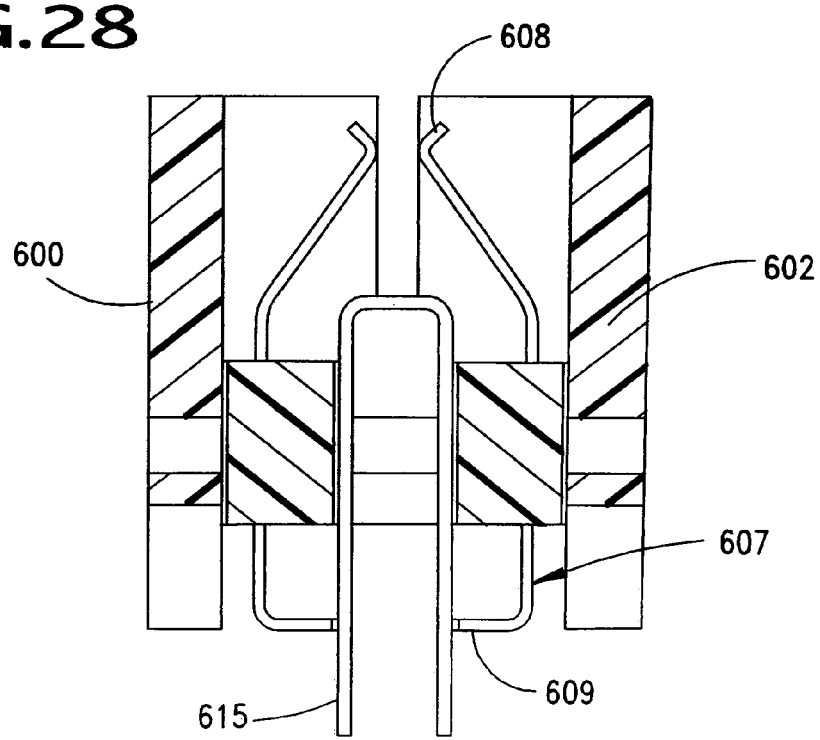
FIG. 28 is a cross-sectional view of the connector of FIG. 26, taken along ines 28—28 thereof.

FIG. 28 is an end view of the connector 600, which illustrates the interposition of the coupling staple between a pair of opposing contacts 608 and the engagement of the connector blocks 610 and the connector housing 602.

Notwithstanding all of the foreging, FIG. 29 illustrates an embodiment of an electro-magnetically shielded transmission line or "channel link" constructed in accordance with the principles of the present invention. In FIG. 29, a planar dielectric substrate 700 with upper 702 and lower 704 planar surfaces has two, parallel slot transmission lines 706 and 708 formed in the substrate 700.

The first slot transmission line 706 is formed by cutting, molding, etching, abraiding or otherwise forming a slot 710 through the substrate 700. By forming the slot 710 through the substrate, two opposing faces or surfaces 712 714 are formed, which will of course be made up of the same material as the substrate 700.

A conductive material 716 is applied to both of the opposing surfaces 712, 714 to form two, electrically separate conductors. Conductive material can be applied by a variety of methods: vapor deposition or sputtering. Metal plated plastic can be used as well. Similarly, a completely plated substrate can be selectively etched whereby metal is removed, leaving the conductive material on the opposing surfaces 712 and 714.

The conductive material 716 on the surface 712 is electrically isolated from conductive material 716 on the other surface 714, and therefore, the conductive material 716 on the surfaces 712, 714 form electrically isolated conductors. These conductors (hereafter also considered to be identified by reference numerals 712 and 714) are separated by a dielectric-filled intervening space (of either air or a selected dielectric) between them, and they form a transmission line to high-frequency signals that are impressed on the conductive material 716 on the opposing conductive surfaces 712, 714.

The second slot transmission line 708 is formed like the first slot transmission line 706. A slot 730 is cut; the opposed surfaces 732 and 734 are coated or metallized by the conductive material 716 applied to both of the opposing surfaces 732, 734. Two electrically-separate conductors formed by the conductive material 716 on the opposing surfaces 732 and 742 are separated by a dielectric to form the second, slot transmission line to high-frequency signals that are applied to the conductive material 716 on the opposing surfaces 732, 734.

For simplicity of description, the conductive material 716 on the first pair of opposing surfaces 712, 714 is hereafter considered to comprise separate electrical conductors, 712 and 714. The conductive material 716 on the second pair of opposing surfaces 734, 744 is hereafter considered to form electrically separate conductors 723 and 734.

The lower planar surface 704 of the dielectric 700 has a conductive material 716 applied to it, which forms a planar ground conductor 740 of the dielectric substrate 700. This planar ground conductor 740 is maintained at a reference potential, e.g., zero volts or "ground" potential, for the signals carried on the conductors 712, 714 and 732, 734. In the preferred embodiment, the signals on the conductors 712 and 714 in the first slot transmission line 706 are differential signals and the conductors 712 and 714 are considered to be a "differential pair." In addition, the signals on the conductors 732 and 734 in the second slot transmission line 708 are differential signals and the conductors 732 and 734 are also considered to be a "differential pair."

FIG. 29 also shows several conductive vias 750. For this description, the term "via" includes any passage way that extends between the upper surface 702 and lower surface 704 of the dielectric substrate 700. A "conductive via" should be considered to a passageway plated or partially or completely filled with an electrically conductive material by which electrical current is conducted through the via 750.

As shown in FIG. 29, the conductive vias 750 are orthogonal to the upper surface 702 and lower surface 704 and extend through the dielectric substrate 700. Alternate embodiments include vias that are non-orthogonal. Regardless of their inclination, they are electrically common with the conductive material 716 that covers the lower surface 704.

At the upper surface 702 of the dielectric substrate 700, the conductive vias 750 are extended into conductive pads 752 (preferably formed from the conductive material 716 applied to the opposing surfaces 712, 714, 732, and 734) that sit on top of the upper surface 702 of the dielectric substrate 700. Each of the conductive pads 752 shown in FIG. 29 have a rectangular area but alternate embodiments include conductive pads that are circular, square, triangular, random or other geometric shapes.

Each of the pads 752 extends away from the conductive via 750 to which it is electrically attached. By stretching the area of the pads 752 away from its via 750, the area of reference potential above the surface area of a corresponding via 750 is increased providing a larger ground area and a better electromagnetic shield. Accordingly, each of the conductive pads 752 extends at least partially toward the slot transmission lines 706 and 708. For example, the conducive pads 752 shown in FIG. 29 to the "left" of the conductive surface 712 of the first slot transmission line 706 have an area greater than the vias 750 to which they are connected and thereby broaden the area of the ground potential, adjacent the slot transmission line. Similarly, the conducive pads 752 to the "right" of the conductive surface 714 of the first slot transmission line 706 have an area greater than the vias 750 to which they are connected, thereby broadening the conductive area at reference potential adjacent the conductive surface 714.

By extending the reference potential of the ground plane 740 on the lower or bottom 704 of the dielectric substrate 700, upward through the dielectric 700 on the vias 750, the vias provide several, reference-potential electrodes adjacent to the slot transmission lines. The vias 750 act as a sort of gate or fence to signals on the transmission lines 706 and 708. By extending the reference potential on the vias 750 to the pads 752 on the upper surface 702, an even larger-area reference potential electrode is provided on the upper surface of the dielectric 700 and even closer to the signals that are carried through the slot transmission lines, shielding the transmission lines even more tightly than if the vias alone were used. The close reference potential shields high-frequency signals more effectively than if they were absent. In an alternate construction, the vias may also connect to a continuous conductive trace on a surface of the body that is established between the signal carrying channel and thereby act as a ground guard.

FIG. 30 shows a sectional view of the substrate 700 through section lines A—A, which are shown in FIG. 29 to be "left" of the second slot transmission line 708. As shown in FIG. 30, spacing between the conductive pads 752 on the upper surface 702 of the dielectric substrate 700 is shown to be relatively small. Spacing between the vias 750 is also relatively small. Because the lower electrode 740 on the lower surface 704 is at ground or other reference potential, the vias 750 and the pads 752 are also at ground or reference potential. When the vias 750 and the pads 752 are provided on both sides of a slot transmission line, as shown in FIG. 29, they provide a ground enclosure to signals on an adjacent slot transmission line. In this manner, they communicate though to the next common ground plane in the next transmission section.

Figure 31:
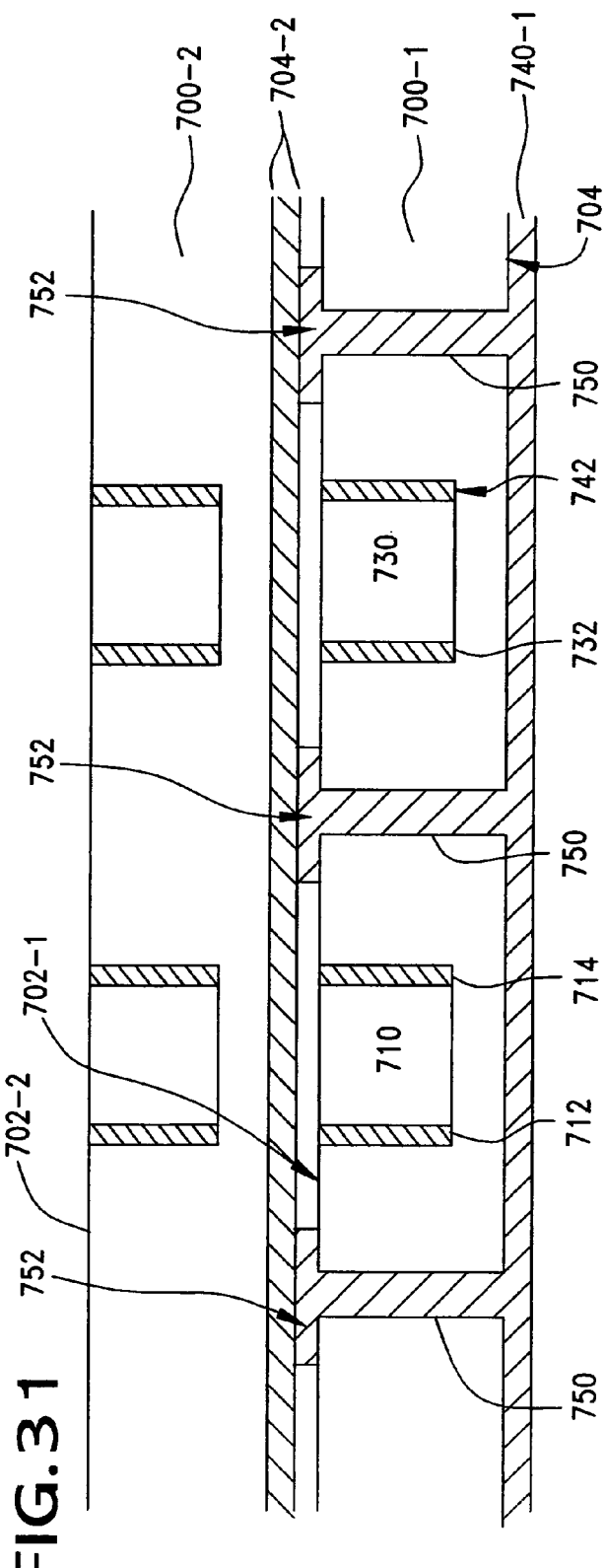

FIG. 31 shows another alternate embodiment of shielded slot transmission lines, however, the shielding in FIG. 31 includes a planar conductive shield 704-2 that is above or "on" the upper surface 702-1 of a first dielectric layer 700-1. The upper planar conductive shield 740-2 is electrically coupled to the conductive pads 752 on the upper surface 702-2 of the first layer 700-1. The upper conductive shield 740-2 is applied to the lower surface 704-2 of a second layer of dielectric 700-2. In so doing, the upper conductive layer 740-2 provides a complete ground encirclement of signals in the slot transmission lines 706 and 708.

Those of ordinary skill in the art will recognize that forming a slot through a dielectric will leave an air gap. This air gap forms the dielectric between the conductive material 716 on the opposing surfaces. A non-air dielectric could certainly be used in the slot transmission lines.

Those of ordinary skill in the art will appreciate that the slot transmission lines described above can be readily formed in a circuit board. As such, electronic components could be readily coupled to the slot transmission lines.

The conductive material 718 deposited on the opposed surfaces of the various sections of transmission line should be considered "differential signal pairs." Those of skill in the art know a "differential signal pair" to be a pair of conductors that each alternating polarity signals. Differential signals are well-known to be those of ordinary skill in the art and the conductors in the embodiments described above should be considered to be useful as differential signal pairs.

What is claimed is:

1. A transmission line comprising:
a substantially planar dielectric substrate having upper and lower opposing surfaces;
a first slot formed through the upper surface of said dielectric substrate, said first slot having first and second opposing faces spaced apart from each other by an intervening space, both first and second opposing slot faces each have a conductive surface that is capable of carrying differential signals thereon;
a planar ground conductor coupled to, and substantially covering the lower surface of the dielectric substrate, said ground conductor being at a reference potential for signals carried on the conductive surfaces on the opposing slot faces; and,
a plurality of first conductive vias arranged in line along a first side of said first slot, each of the first conductive vias being electrically contacting the planar around conductor and extending through the substantially planar dielectric substrate from the lower surface to the upper surface, said plurality of first conductive vias being located adjacent to the conductive surface on said first opposing face;
a plurality of second conductive vias arranged in line along a second side of said first slot, each of the second conductive vias being electrically contacting the planar ground conductor and extending through the substantially planar dielectric substrate from the lower surface to the upper surface, said plurality of second conductive vias being located adjacent to the conductive surface on said first opposing face;
a plurality of first conductive pads spaced apart from each other and arranged in a line along a first side of said first slot, the first conductive pads being electrically connected to said first conductive vias;
a plurality of second conductive pads spaced apart from each other and arranged in a line along a second side of said second slot, the second conductive pads being electrically connected to said second conductive vias.

2. The transmission line of claim 1, further comprised of a planar ground conductor electrically coupled to said first and second substantially planar conductive pads on the upper surface and extending over the upper surface of the dielectric substrate.

3. The transmission line of claim 1, further including a non-air dielectric material at least partially filling said intervening space.

4. The transmission line of claim 1, further including a second planar ground conductor coupled to, and substantially covering the area above the upper surface of the dielectric substrate, said second planar ground conductor being at a reference potential for signals carried on the conductive surfaces on the opposing slot faces.

5. A circuit board comprising:
a substantially planar dielectric substrate having upper and lower opposing surfaces;
a first slot transmission line formed in the upper surface of said dielectric substrate, said first slot transmission line having first and second opposing faces spaced apart from each other by an intervening space, both opposing slot faces each have a conductive surface that is capable of carrying a first differential signal thereon;
a second slot transmission line formed in the upper surface of said dielectric substrate, said second slot transmission line also having first and second opposing faces spaced apart from each other by an intervening space, both opposing slot faces of said second slot transmission line each have a conductive surface that is capable of carrying a second differential signal thereon, at least part of said second slot transmission line being parallel to and laterally displaced from said first slot transmission line in the dielectric substrate;
a planar ground conductor coupled to, and substantially covering the lower surface of the dielectric substrate, said ground conductor being at a reference potential for signals carried on the conductive surfaces on the opposing slot faces of said first and second slot transmission lines;
a second planar ground conductor substantially covering the area above the first slot transmission line and the second slot transmission line, said second planar ground conductor being electrically coupled to the plurality of conductive vias between the first and second slot transmission lines;
and, a plurality of conductive vias extending through the substantially planar dielectric substrate, said conductive vias being electrically connected to, and extending from the planar ground conductor, through the upper surface of the dielectric substrate, said conductive vias being located between the first and second slot transmission lines.

6. The transmission line of claim 5, further including a substantially planar conductive pad on the upper surface of said planar dielectric substrate, said substantially planar conductive pad being electrically coupled to a corresponding conductive via, each conductive pad extending away from its corresponding via toward the first conductive surface on the first opposing face of said first slot transmission line and toward the second conductive surface on the second opposing face of said second slot transmission line so as to provide a reference potential between the first and second slot transmission lines.

7. The transmission line of claim 5, wherein said conductive vias are substantially equidistant from the second opposing face of said first slot transmission line and the first opposing face of said second slot transmission line.

8. A transmission line comprising:
- a substantially planar dielectric substrate having upper and lower opposing surfaces;
- a first slot formed through the upper surface of said dielectric substrate, said first slot having first and second opposing faces spaced apart from each other by an intervening space, both first and second opposing slot faces each have a conductive surface that is capable of carrying differential signals thereon;
- a planar ground conductor coupled to, and substantially covering the lower surface of the dielectric substrate, said ground conductor being at a reference potential for signals carried on the conductive surfaces on the opposing slot faces;
- a first conductive via, extending through the substantially planar dielectric substrate from the lower surface to the upper surface, said first conductive via being located adjacent to the conductive surface on said first opposing face;
- a first substantially planar conductive pad on the upper surface of said substantially planar dielectric substrate, said conductive pad extending away from the first conductive via on the upper surface and toward the conductive surface on said first opposing face, said conductive pad being electrically coupled to said conductive via;
- a second conductive via, extending through the substantially planar dielectric substrate from the lower surface to the upper surface, said second conductive via being located adjacent to the conductive surface on said second opposing face and electrically contacting the planar ground conductor; and,
- a second substantially planar conductive pad on the upper surface of said substantially planar dielectric substrate, said conductive pad extending away from the second conductive via on the upper surface and toward the conductive surface on said second opposing face, said conductive pad being electrically coupled to said conductive via.

* * * * *